(12) United States Patent
Ciubotaru

(10) Patent No.: US 9,379,672 B2
(45) Date of Patent: Jun. 28, 2016

(54) DIFFERENTIAL CURRENT AMPLIFIER

(71) Applicant: ANALOG DEVICES, INC., Norwood, MA (US)

(72) Inventor: Alexandru A. Ciubotaru, Somerset, NJ (US)

(73) Assignee: Analog Devices, Inc., Norwood, MA (US)

( * ) Notice: Subject to any disclaimer, the term of this patent is extended or adjusted under 35 U.S.C. 154(b) by 74 days.

(21) Appl. No.: 14/282,855

(22) Filed: May 20, 2014

(65) Prior Publication Data

US 2015/0341003 A1    Nov. 26, 2015

(51) Int. Cl.
*H03F 3/45*    (2006.01)
*H03F 1/26*    (2006.01)
*H03F 3/195*   (2006.01)

(52) U.S. Cl.
CPC .......... *H03F 1/26* (2013.01); *H03F 3/195* (2013.01); *H03F 3/45273* (2013.01); *H03F 2200/261* (2013.01); *H03F 2200/453* (2013.01); *H03F 2200/456* (2013.01); *H03F 2200/91* (2013.01); *H03F 2203/45151* (2013.01); *H03F 2203/45418* (2013.01)

(58) Field of Classification Search
CPC .............................. H03F 3/45466; H03F 1/26
USPC .................................................. 330/252–261
See application file for complete search history.

(56) References Cited

U.S. PATENT DOCUMENTS

| 5,629,641 | A | 5/1997 | Cheng |
| 6,583,670 | B2 | 6/2003 | Wang |
| 7,466,202 | B2 | 12/2008 | Karthaus et al. |
| 2007/0241818 | A1* | 10/2007 | Alenin ............... H03F 1/26 330/257 |

OTHER PUBLICATIONS

Koli, Kimmo et al., "CMOS Current Amplifiers—Speed versus Nonlinearity", Kluwer Academic Publishers, ISBN 0-306-48003-4, © 2003 Kluwer Academic Publishers, 7 pages.
Kwon, Ickjin et al., "An Integrated Low Power Highly Linear 2.4-GHz CMOS Receiver Front-End Based on Current Amplification and Mixing", IEEE Microwave and Wireless Components Letters, vol. 15, No. 1, Jan. 2005, 3 pages.
Minaei, Shahram et al., "A New CMOS Electronically Tunable Current Conveyor and Its Application to Current-Mode Filters", IEEE Transactions on Circuits and Systems—I: Regular Papers, vol. 53, No. 7, Jul. 2006, 10 pages.

(Continued)

*Primary Examiner* — Khanh V Nguyen
*Assistant Examiner* — Khiem Nguyen
(74) *Attorney, Agent, or Firm* — Patent Capital Group

(57) ABSTRACT

A current amplifier is disclosed. The circuit has differential input and output and can be implemented in CMOS or bipolar integrated-circuit technologies. The input current is injected into a pair of primary branches, and is re-used at the output of the circuit without changing its natural flow, thus contributing to the overall current gain. A pair of secondary branches is connected to the primary branches in such a way as to provide currents proportional to the input currents according to a scaling factor dictated by the geometry of the transistors. The outputs of the secondary branches are cross-coupled relative to the outputs of the primary branches, in this way ensuring maximum current gain by the summing of the primary and secondary signal currents at the circuit output, without consuming additional DC power.

20 Claims, 17 Drawing Sheets

(56) References Cited

OTHER PUBLICATIONS

Palmisano, Giuseppe et al., CMOS Current Amplifiers, The Kluwer International Series in Engineering and Computer Science, Kluwer Academic Publishers, © 1999 by Kluwer Academic Publishers, 3 pages.

Surakampontorn, W. et al., "CMOS-Based Electronically Tunable Current Conveyor", Electronics Letters, Jul. 2, 1992, vol. 28, No. 14, 2 pages.

Tanguay, Louis-François et al., "A Very-High Output Impedance Current Mirror for Very-Low Voltage Biomedical Analog Circuits", 978-1-4244-2342-2/08/$25.00 © IEEE, 4 pages.

Toumazou C. et al., "Analogue IC design: the current-mode approach", Peter Peregriunus Ltd., 1990, 4 pages.

Yuan, Fei, "CMOS Current-Mode Circuits for Data Communications", Design Techniques for Current Mode Circuits, Springer, ISBN 0-387-29758-8, ISBN 978-0-387-47691-9, © 2007, 8 pages.

\* cited by examiner

DIFFERENTIAL CURRENT AMPLIFIER

TECHNICAL FIELD OF THE DISCLOSURE

The present invention relates to the field of integrated circuits, in particular to current amplifiers.

BACKGROUND

Integrated circuits process electrical signals to produce rich electronic applications. In signal processing applications where wide bandwidth, low power consumption, and low voltage operation are simultaneously required, current-mode circuits have an advantage over voltage-mode circuits, especially due to the fact that the inherent parasitic capacitances present in the circuit do not have to be charged/discharged with large voltage swings.

In the context of current-mode circuits, current amplifiers are important building blocks. Current amplifiers can amplify an input current signal such that an amplified current output can be used in another part of the circuit. Current amplifiers can serve as adjoint elements to voltage amplifiers, and making possible important circuit transformations between voltage and current domains, although they can also be found in predominantly voltage-mode applications. Designing current amplifiers is not trivial, since a designer faces many constraints such as efficiency, cost, achievable gain, and bandwidth. In cases where lower cost and ease of or ability to integrate with modern digital circuitry are required, Complementary metal-oxide-semiconductor (CMOS) current amplifiers are preferred over bipolar implementations.

OVERVIEW

A current amplifier is disclosed. The circuit has differential input and output and can be implemented in CMOS or bipolar integrated-circuit technologies. The input current is injected into a pair of primary branches, and is re-used at the output of the circuit without changing its natural flow, thus contributing to the overall current gain. A pair of secondary branches is connected to the primary branches in such a way as to provide currents proportional to the input currents according to a scaling factor dictated by the geometry of the transistors. The outputs of the secondary branches are cross-coupled relative to the outputs of the primary branches, in this way ensuring maximum current gain by the summing of the primary and secondary signal currents at the circuit output, without consuming additional direct current (DC) power.

An additional circuit can be used at the output for absorbing the DC currents originating in the amplifier, and providing high-frequency bidirectional currents at the output by means of DC-blocking capacitors. At high frequencies, a low-headroom version of the circuit can be constructed using alternating current (AC) coupling between the primary and secondary branches.

BRIEF DESCRIPTION OF THE DRAWING

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Understanding Current Amplifiers

One important factor in designing current amplifiers is the current gain, i.e., the ratio of the output current with respect to the input current. Another important factor in designing current amplifiers is efficiency, i.e., how much power the circuit consumes to provide the desired current gain. Yet another important factor is the amount of headroom needed to operate the current amplifier, i.e., the amount of voltage power supply voltage available for the circuit.

In one conventional implementation, a CMOS current mirror can be used to provide current gain based on geometrical scaling between input and output transistors. From a signal perspective it is noted that input transistor serves only the purpose of generating a voltage for output transistor with the input current signal diverted away from the output path. As a consequence, this current amplifier is inefficient especially at low-to-moderate gains (from the perspective of gain relative to DC current consumption), because the input transistor diverts the input current signal away from the output node, and requires a dedicated DC bias current.

Other conventional current amplifiers are equally inefficient from the perspective of gain relative to DC current consumption. For instance, some cascode current-mirror topologies, where the presence of input branch requires DC power consumption and diverts the input current from the output node, are inefficient in the same way as the more advanced current mirrors.

While some conventional current buffers do re-use the input current where the input current is routed directly to the output, the current gain is only unity and cannot be changed by transistor scaling. One known efficient structure that constructively re-uses the input at the output is the bipolar Gilbert current gain cell. This cell, however, requires additional headroom for the common-tail current source, and has potential issues related to the finite transistor beta.

An Improved Unity-Gain Current Amplifier

Figure 1:
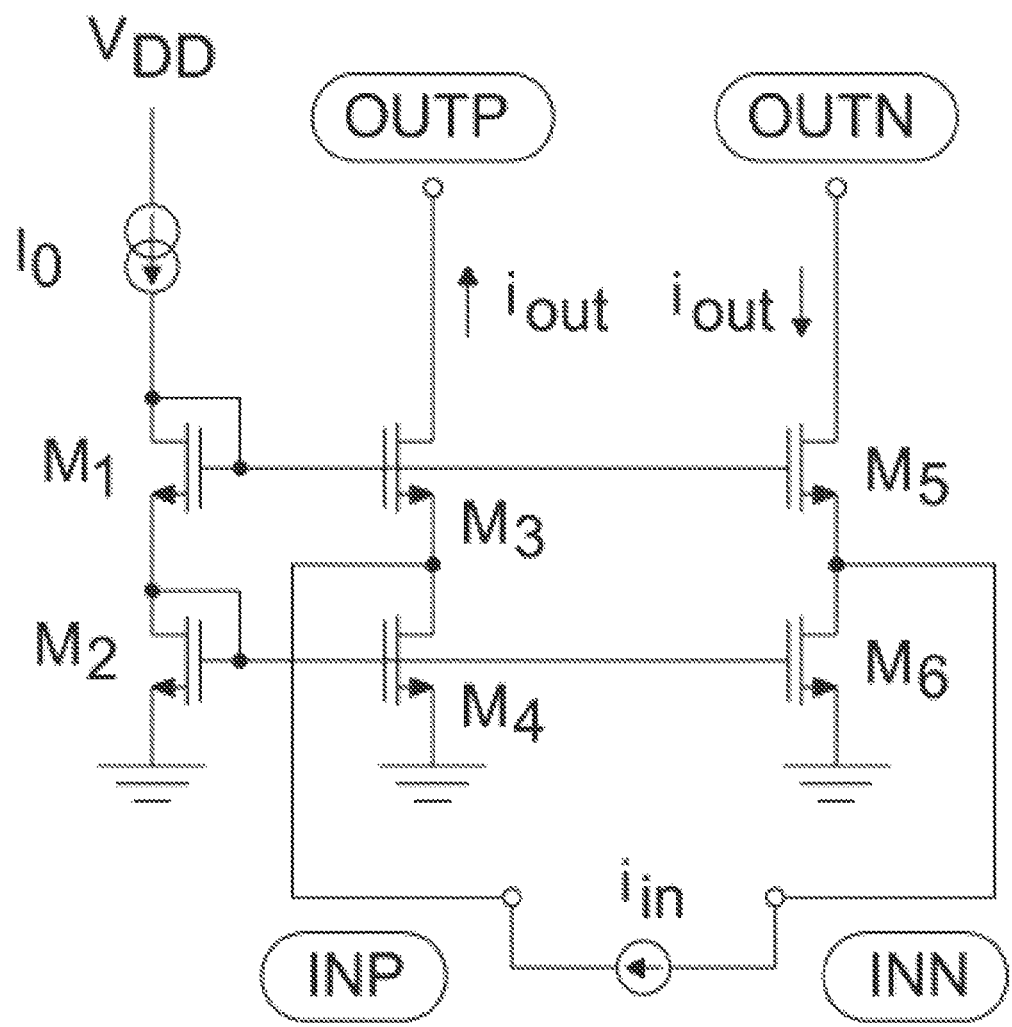
FIG. 1 is a diagram illustrating a CMOS unity-gain differential current amplifier comprising primary amplifier branches, according to some embodiments of the disclosure.

FIG. 1 is a diagram illustrating an exemplary CMOS unity-gain differential current amplifier comprising primary amplifier branches, according to some embodiments of the disclosure. The circuit is trivial but serves as starting point for other topologies described herein. The unity-gain differential current amplifier includes a first and second primary non-inverting unity gain branches having the input current signal $i_{in}$ ($i_{in}$ and $-i_{in}$ for differential current signaling) injected into the respective first and second primary branches. During operation, the input current signal $i_{in}$ is provided from the differential input nodes (shown as "INP" and "INN") into the first and second primary branches and contributes to the current output signal $i_{out}$ (in the direction shown in the FIGURE) at the outputs of the first and second primary branches, i.e., the differential output nodes of the current amplifier (shown as "OUTP" and "OUTN"). Accordingly, this configuration allows the input current signal $i_{in}$ to be re-used at the differential output nodes as the (unity-gain) current output signal $i_{out}$.

In this example, the first primary branch comprises two transistors M3 and M4. In this CMOS implementation, the source of M3 is connected to the drain of M4, and the input current signal $i_{in}$ is injected between M3 and M4 (i.e., at the source of M3 and at the drain of M4). The drain of M3 is connected to the output node OUTP, and the source of M4 is connected to ground. The second primary branch comprises two transistors M5 and M6. Similar to the first primary branch, the source of M5 is connected to the drain of M6, and the complement of the input current signal $-i_{in}$ is injected between M5 and M6 (i.e., at the source of M5 and at the drain of M6). The drain of M5 is connected to the output node OUTN, and the source of M6 is connected to ground.

Further to primary branches, a reference branch is provided to operate the transistors of the primary branches (M3, M4, M5, and M6) in the saturation region. The reference branch comprises a current source $I_0$ and one or more diode-connected transistors, such as M1 and M2 (e.g., n-type metal oxide semiconductor field effect transistor (NMOS transistors where the drain of the transistor is connected to the gate). The diode-connected transistors M1 and M2 are substantially identical, and are provided to establish the DC operating points through branches formed by M3, M4, M5, and M6. The transistors M3, M4, M5, and M6 can be identical scaled versions of transistors M1 or M2.

In this way, assuming all transistors are operating in the saturation region, if an input current signal $i_{in}$ is applied between input node INP and input node INP, an current output signal $i_{out}=i_{in}$ flows as indicated through the output nodes OUTP and OUTN, making the circuit a differential unity-gain current amplifier. Because the input currents are fully used at the output without consuming additional DC current, the efficiency of this structure (from the perspective of gain relative to DC current consumption) is maximal. The current gain, however, is only unity, which limits this circuit's applicability.

An Improved Current Amplifier Having Secondary Branches to Provide Current Gain

Figure 2:
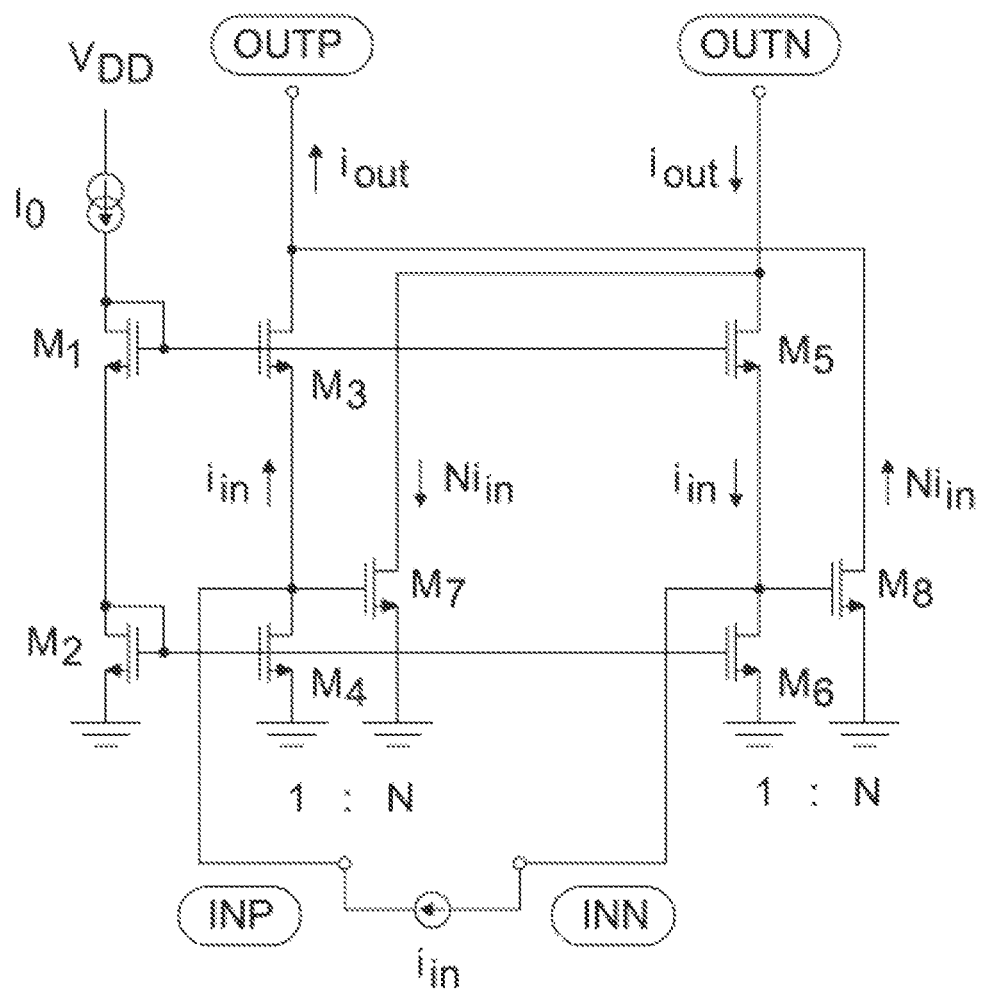
FIG. 2 is a diagram illustrating a CMOS differential current amplifier having a gain of (N+1), according to some embodiments of the disclosure.

FIG. 2 is a diagram illustrating a CMOS differential current amplifier having a gain of (N+1), according to some embodiments of the disclosure. This structure adds first and second secondary branches scaled with respect to the first and second primary branches. The first and second secondary branches are cross-coupled relative to the outputs the first and second primary branches to provide current gain, wherein the current gain is based on a scaling factor between the primary branches and the secondary branches. The result is a differential current amplifier configured for providing an amplified current output signal $i_{out}=(N+1)i_{in}$ at a pair of differential output nodes (OUTP and OUTN) based on an input current signal $i_{in}$ provided at a pair of differential inputs nodes (INP and INN). Furthermore, the output currents of the first and second primary branches (equivalent to $i_{in}$ and $-i_{in}$ respectively) are constructively added to the output currents of the second and first secondary branches respectively (equivalent to $Ni_{in}$ for the second secondary branch and $-Ni_{in}$ for the first secondary branch) to provide the amplified current output signal $i_{out}=(N+1)i_{in}$ at the pair of differential output nodes OUTP and OUTN. The overall gain of the amplified current output signal relative to the input current signal is thus 1 plus the scaling factor N. Within the context of the disclosure, N is greater than zero to provide a non-unity gain current amplifier.

In this illustration, the first secondary branch includes NMOS transistor M7 and the second secondary branch includes NMOS transistor M8. M7 and M8 are substantially identical. The first secondary branch is cross coupled relative to the output of the second primary branch by connecting the drain of M7 to the output of the second primary branch (the drain of M5). The drain of M4 is connected to the gate of M7. The second secondary branch is cross coupled relative to the output of the first primary branch by connecting the drain of M8 to the output of the first primary branch (the drain of M3). The drain of M6 is connected to the gate of M8.

During operation, the input current signal $i_{in}$ injected at the first primary branch provides a first voltage at the node connecting the drain of M4, the source of M3, and the gate of M7. Accordingly, M7 draws a first scaled current $Ni_{in}$ at the output of the second primary branch ($Ni_{in}$ being constructively added to $i_{out}=i_{in}$ present the output terminal OUTN). Furthermore, the input current signal $-i_{in}$ injected at the second primary branch provides a second voltage at the node connecting the drain of M6, the source of M5, and the gate of M8. Accordingly M8 draws a second scaled current $Ni_{in}$ at the output of the first primary branch (Ni$_{in}$ being constructively added to i$_{out}$=i$_{in}$ present the output terminal OUTP).

If the gate widths W and lengths L of the M7 and M8 are selected according to a scaling factor with respect to the transistors of the primary branches such that $$\left(\frac{W}{L}\right)_{7,8} = N \cdot \left(\frac{W}{L}\right)_{3,5},$$

ignoring transistor parasitics such as the drain-source conductance and body effect, then it can be shown that i$_{out}$=(N+1)i$_{in}$, which makes the circuit a differential current amplifier of gain (N+1).

Due to the cross-coupled transistor arrangement, the structure of FIG. 2 substantially fully re-uses the input current in the amplified current output signal. In the absence of this re-use, if the circuit output were taken only from the secondary branches (i.e., M7 and M8, as in a conventional current mirror), the circuit would have a current gain of only N with a total DC current consumption (ignoring the M1-M2 reference branch) of 2·I$_{DC3,5}$·(N+1); taking the ratio $$\eta = \frac{\text{gain} \cdot 2 \cdot I_{DC3,5}}{\text{DC current consumption}}$$

as an efficiency factor, the structure with current output signal is taken only from the secondary branches would have an efficiency:

$$\eta = \frac{2N}{2(N+1)}.$$

For the circuit shown in FIG. 2, where the current output signal is taken from the primary branches with the cross-coupling of the secondary branches, the efficiency is:

$$\eta = \frac{2(N+1)}{2(N+1)} = 1.$$

In other words, the efficiency is 1 regardless of scaling factor N. Generally speaking, if N is large, the issue of efficiency is not significant. However, for low-to-moderate values of N (e.g., N≤5), efficiency loss can be significant. In a current amplifier without current re-use, the current gain is smaller by 1 than the current gain with re-use of the input current signal. Without re-use, the efficiency is noticeably smaller for N=5, η=0.83, and for N=2, η=0.66. The efficiency aspect is important for minimizing power consumption in current amplifiers that need to operate at high frequencies (e.g., 1-2 GHz using 65 nm CMOS), where current consumption tends to be high (several milliamps through the first (M3-M4) or second (M5-M6) secondary branches).

Example Current Amplifier with an Output Cascode

Figure 3:
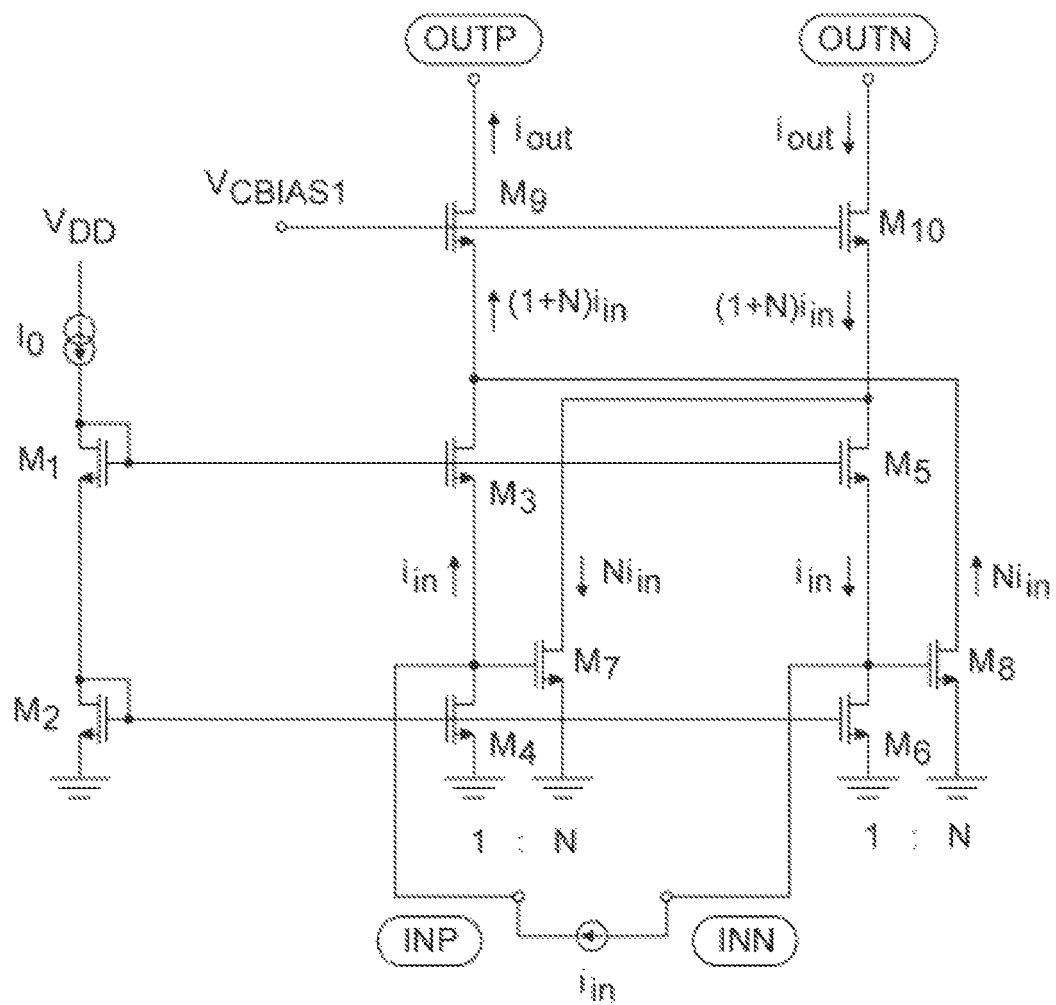
FIG. 3 is a diagram illustrating a CMOS differential current amplifier having a gain of (N+1) and an output cascode, according to some embodiments of the disclosure.

FIG. 3 is a diagram illustrating a CMOS differential current amplifier having a gain of (N+1) and an output cascode, according to some embodiments of the disclosure. To provide higher output impedance, a cascode can be added to respective outputs of the first and second primary branches seen in FIG. 2. In the example shown in FIG. 3, cascode transistors M9 and M10 are provided at the outputs of the first primary branch and the second primary branch. The cascode transistors provide high output impedance, and a first bias voltage V$_{CBIAS1}$ is provided to the cascode transistors to operate transistors in the first and second primary branches (e.g., M3, M5, and implicitly M7 and M8) and transistors of the first and second secondary branches in the saturation region. In the illustration shown in FIG. 3, the first bias voltage is provided to the gates of M9 and M10, and the sources of M9 and M10 are connected to the drains of M3 and M5 respectively.

Figure 4:
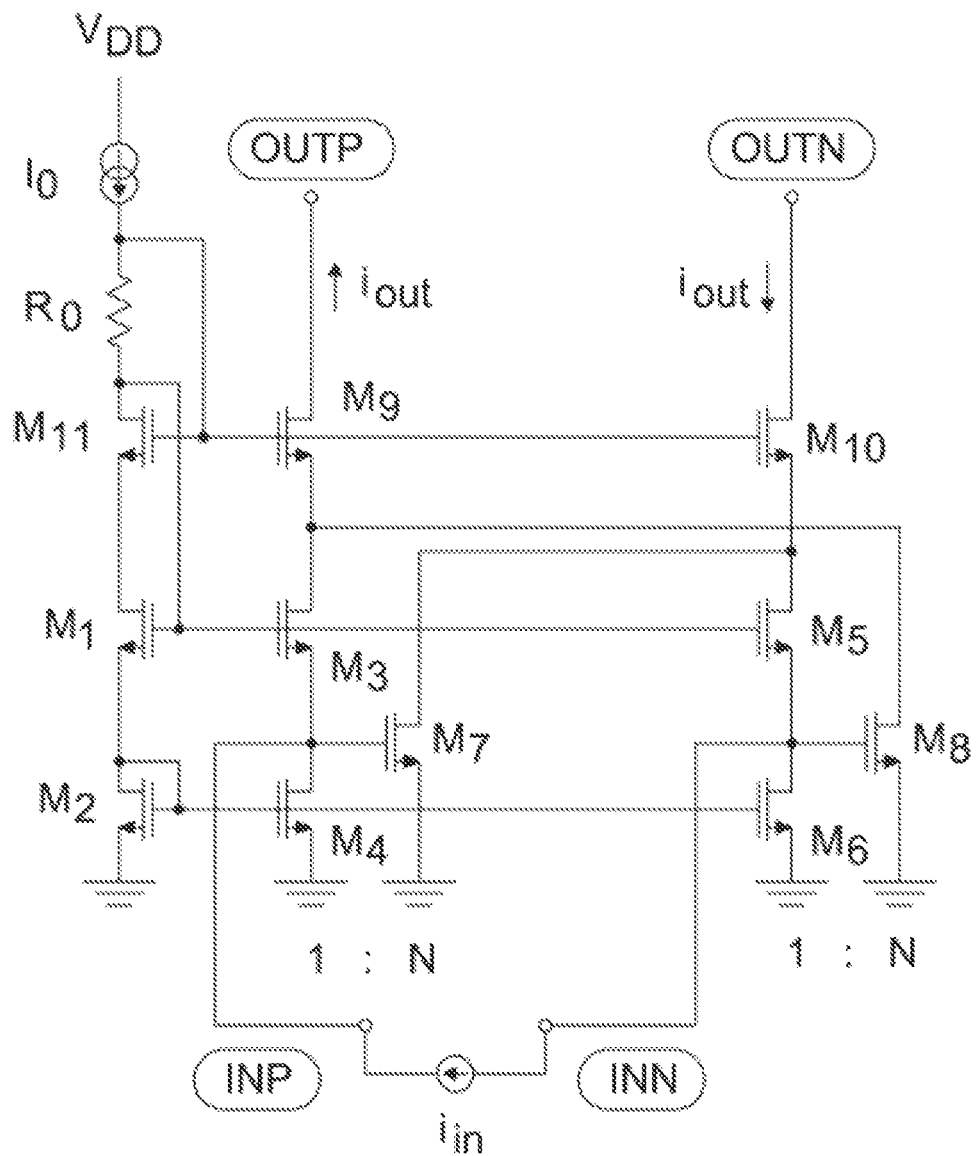
FIG. 4 is a diagram illustrating an exemplary bias arrangement for the main transistors and output cascode transistors of FIG. 3, according to some embodiments of the disclosure.

FIG. 4 is a diagram illustrating an exemplary bias arrangement for the main transistors of the first and second primary branches and output cascode transistors of FIG. 3, according to some embodiments of the disclosure. To provide the first bias voltage V$_{CBIAS1}$, the reference branch can be configured to include a self-biased cascode formed by transistors M1, M11 and resistor R$_0$. Specifically, the resistor R$_0$ is provided between one terminal of the current source I$_0$ (bias current) and the drain of M11. The drain of M11 is connected to the gate of M1. The source of M11 is connected to the drain of M1. The gate of M11 is connected to the gate of M9 and the gate of M10 to provide the first bias voltage V$_{CBIAS1}$·I$_0$ and R$_0$ can be selected to ensure that the transistors M9, M10 (as well as M3, M4, M5, and M6) are operating in the saturation region (e.g., barely above triode region to save headroom).

Figure 5:
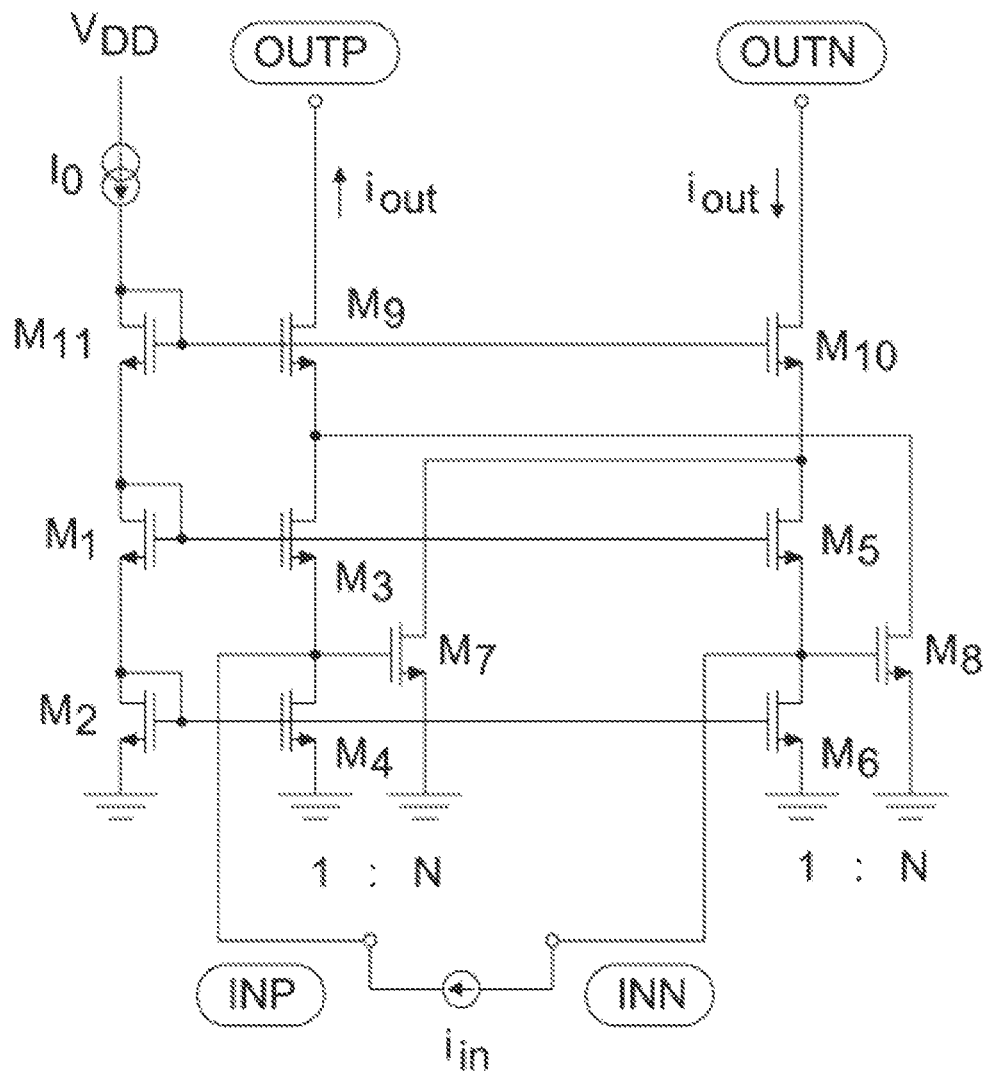
FIG. 5 is a diagram illustrating another exemplary bias arrangement for the main transistors and output cascode transistors of FIG. 3, according to some embodiments of the disclosure.

FIG. 5 is a diagram illustrating another exemplary bias arrangement for the main transistors the first and second primary branches and output cascode transistors of FIG. 3, according to some embodiments of the disclosure. In this alternative embodiment, the first bias voltage V$_{CBIAS1}$ is provided using a diode connected transistor M11 in the reference branch (where the drain of M11 is connected to the gate of M11). The diode connected transistor M11 can be provided between one terminal of current source I$_0$ (bias current) and the drain of M1. The source of M11 is connected to the drain of M1 (and the gate of M1 as well due to M1 being a diode-connected transistor). The gate of M11 is connected to the gate of M9 and the gate of M10 to provide the first bias voltage V$_{CBIAS1}$.

Example Current Amplifier with Transconductance Configuration

Figure 6:
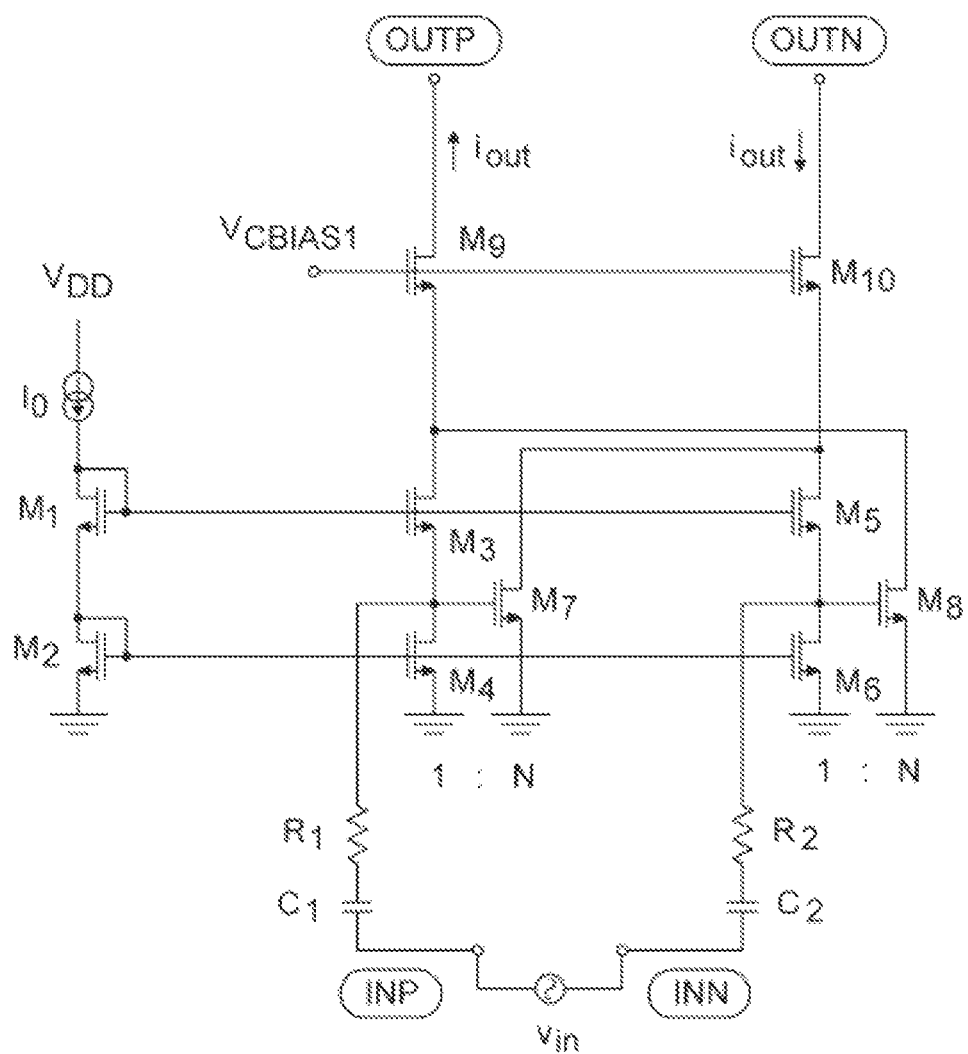
FIG. 6 is a diagram illustrating an exemplary CMOS transconductor configuration, according to some embodiments of the disclosure.

In some cases, an ideal input current signal i$_{in}$ is not available. Rather, the input can be an input voltage signal v$_{in}$. In these cases, the input current signal i$_{in}$ can still be generated using the input voltage signal v$_{in}$. FIG. 6 is a diagram illustrating an exemplary CMOS trans-conductor configuration, according to some embodiments of the disclosure. In this illustration, two alternating current (AC) coupled resistors each comprising a capacitor and a resistor in series with the differential input nodes INP and INN can be provided. Specifically, C1 and R1 are connected in series with input node INP, and C2 and R2 are connected in series with input node INN. The AC coupled resistors can be provided for converting the input voltage signal v$_{in}$ into the input current signal i$_{in}$. Preferably, R1 and R2 are substantially identical with the same resistance (R1=R2). C1 and C2 are also preferably substantially identical with the same capacitance (C1=C2). The capacitors C1 and C2 can serve as short-circuits at the frequencies of interest.

It can be shown that the transconductance gain of the circuit is:

$$A_y = \frac{i_{out}}{v_{in}} = \frac{N+1}{2\left(R_{1,2} + \frac{1}{g_{m3,5}}\right)},$$

where $g_{m3}=g_{m5}$ is the small-signal transconductance of transistor M3 or M5. If $g_{m3,5}$ are sufficiently high such that $$\frac{1}{g_{m3,5}} \ll R_{1,2},$$

then the transconductance gain is approximately:

$$A_y \cong \frac{N+1}{2R_{1,2}}.$$

Example Current Amplifier Absorbing the DC Currents, and Providing High-Frequency Bidirectional Currents at the Outputs The direct current (DC) currents of the amplifiers (i.e., currents at the outputs of the first and second primary branches in combination with the first and second secondary branches) shown in FIGS. 1-6 can be accommodated by high-impedance differential loads that present a relatively low impedance to the DC common-mode currents originating in the amplifier core (i.e., the primary and secondary branches), while providing bidirectional output currents through the DC-blocking capacitors.

Figure 7:
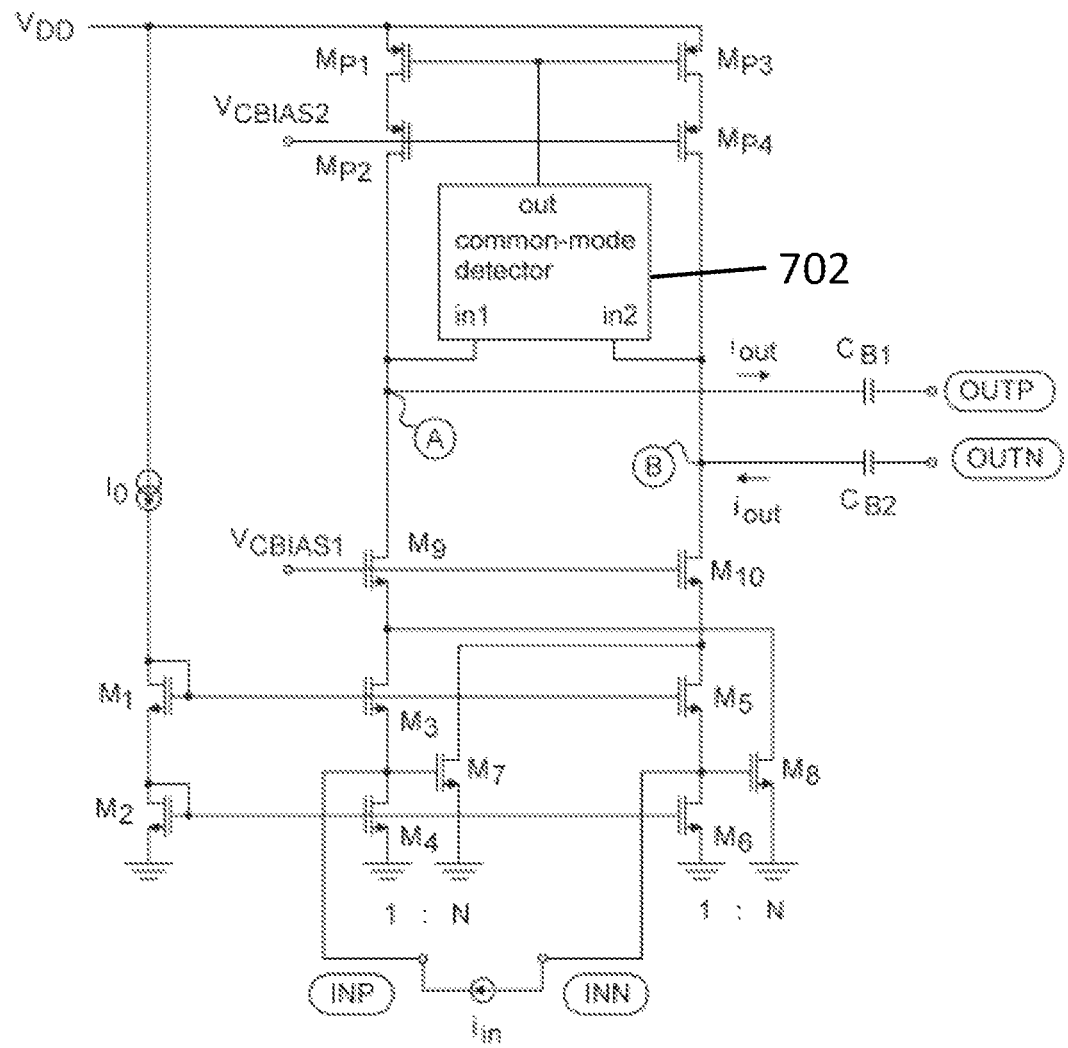
FIG. 7 is a diagram illustrating a differential current amplifier with a gain of (N+1), and a differential load with a common-mode detector circuit for accommodating the DC currents of the amplifier, according to some embodiments of the disclosure.

FIG. 7 is a diagram illustrating a differential current amplifier with a gain of (N+1), and a differential load with a common-mode detector circuit for accommodating the DC currents of the amplifier, according to some embodiments of the disclosure. In this example, the DC currents of the amplifier (such as the current amplifier shown in FIG. 3), can be absorbed by identical PMOS transistors (p-type metal oxide semiconductor field effect transistors) MP1, MP3, and identical PMOS cascodes MP2, MP4 biased by a second bias voltage $V_{CBIAS2}$ (MP2 and MP4 are optional). The PMOS transistors MP1, MP3, and MP2, and MP4 form current absorbing circuits. As shown, the sources of MP1 and MP3 are connected to $V_{DD}$. The drains of MP1 and MP3 are connected to the sources of MP2 and MP4 respectively. The drains of MP2 and MP4 are connected to node A and node B respectively. The cascodes MP2 and MP4 (connected to respective outputs of the first and second primary branches) are biased by a second bias voltage $V_{CBIAS2}$, and the transistors MP1 and MP3 are biased by the output of the common mode detector 702. The common-mode detector circuit 702 (having inputs connected between nodes A and B, and an output connected to the gates of MP1, and MP3) serve to control MP1 and MP3.

Specifically, a common mode detector circuit 702 (connected to the outputs of the first and second primary branches) is configured for providing, as output, a common mode voltage present at the outputs of the first and second primary branches (nodes A and B). The common mode voltage can be seen as the sum of the voltages at node A and node B divided by 2.

With all transistors operating in the saturation region, the operation of the common-mode detector 702 is based on providing a voltage proportional to $v_A+v_B/2$ to the gates of MP1 and MP3, and assisting these transistors through local negative feedback in absorbing DC currents of M3, M8, and M5, M7, respectively. In other words, the common mode detector circuit provides negative feedback to the current absorbing circuits (e.g., transistors MP1 and MP3) to absorb common mode currents present at the outputs of the first and second primary branches (nodes A and B). The negative feedback provided by the common mode-detector to the transistors MP1 and MP3 works by pulling the voltage at the gates of MP1 and MP3 based on the common mode voltages at nodes A and B. If the voltages of nodes A and B are dropping, the gate voltages of MP1 and MP3 will also drop. As a result, more current is injected to the first and second primary branches, and the voltages present at nodes A and B would tend to rise.

Assuming negligible transistor parasitics, the differential output impedance between nodes A and B is high due to essentially zero signal on the MP1 and MP3 gates, as a consequence, the output current is forced to flow through output DC blocking capacitors CB1 and CB2, which are in series with the differential output nodes OUTP and OUTN for providing bidirectional currents at the differential output nodes. CB1 and CB2 present a sufficiently low impedance (act as short circuits) at the frequencies of interest.

Figure 8:
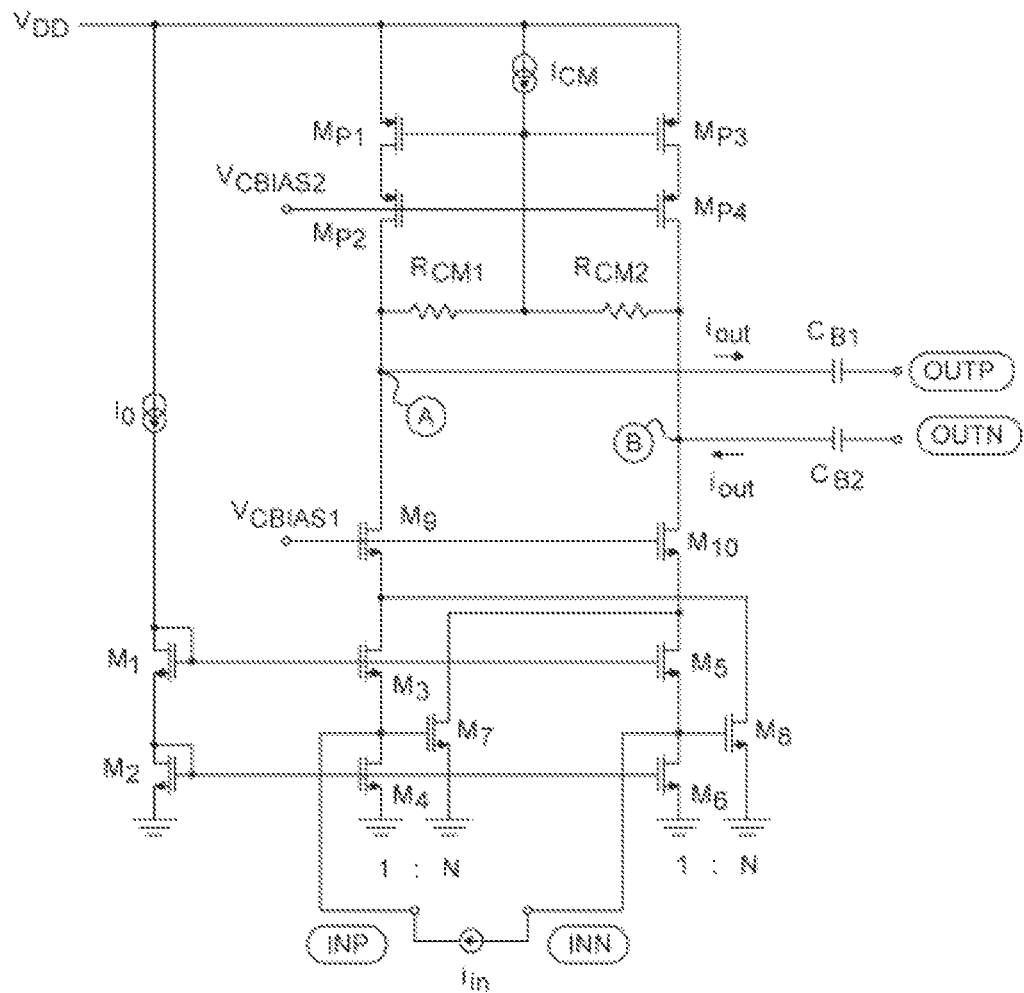
FIG. 8 is a diagram detailing an exemplary common-mode detector for the circuit of FIG. 7, according to some embodiments of the disclosure.

FIG. 8 is a diagram detailing an exemplary common-mode detector for the circuit of FIG. 7, according to some embodiments of the disclosure. This illustration shows the common mode detector circuit comprising two equally sized resistors (e.g., large resistors $R_{cm1}=R_{cm2}$) connected across outputs of the first and second primary branches (nodes A and B). The output of the common mode detector is taken at a node between the two equally sized resistors $R_{cm1}$ and $R_{cm2}$. The output voltage thus has a voltage proportional to common mode voltage present at the outputs of the first and second primary branches.

Optionally, the current amplifier further includes a current source $I_{CM}$ for operating the current absorbing circuits in the saturation region. $I_{CM}<2(N+1)I_{D3,5}$ where $I_{D3,5}$ is the DC drain current of M3 or M5. The current source effectively provides extra headroom voltage $$\frac{I_{CM}}{2} R_{CM1,2}$$

across transistors MP2 and MP4.

Figure 9:
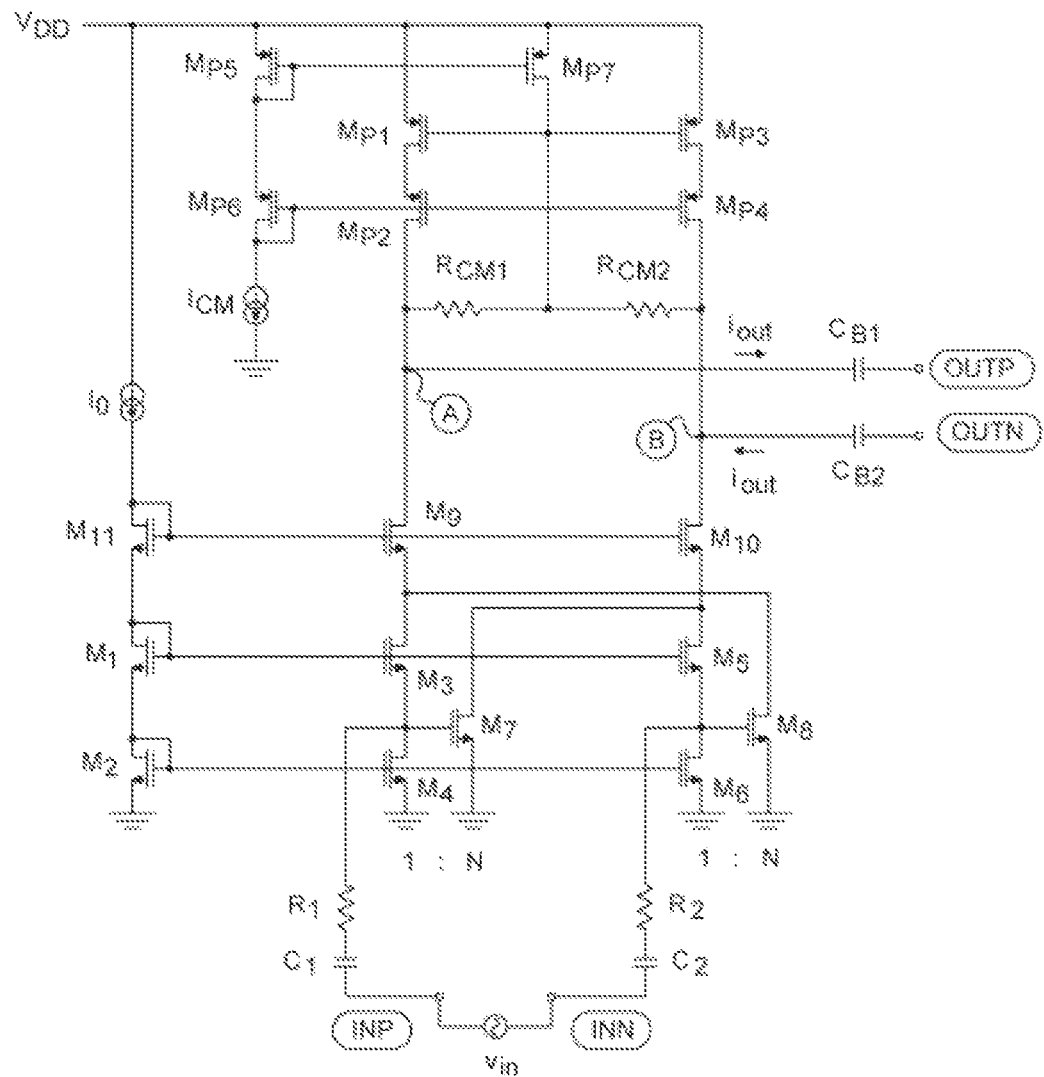
FIG. 9 is a diagram detailing an exemplary transconductor configuration using the exemplary output circuit of FIG. 8, according to some embodiments of the disclosure.

FIG. 9 is a diagram detailing an exemplary transconductor configuration using the exemplary output circuit of FIG. 8, according to some embodiments of the disclosure. The example shown generates the first and second bias voltages $V_{CBIAS1}$ and $V_{CBIAS2}$ using transistors M11 and MP6 respectively, using supply voltage $V_{DD}$ such as 2.5 Volts. Moreover, this illustration shows that the current source $I_{CM}$ can be implemented using a current mirror by adding transistors MP5, MP6 and MP7 (and another current source $I_{CM}$). The current mirror comprises diode connected transistor MP5 (gate and source of MP5 are connected), where the source of MP5 is connected to $V_{DD}$, and the drain of MP5 is connected to the source of MP6. The gate of MP5 is connected to MP7 which forces MP7 to mirror the current going through MP5 (the gate of MP5 serves as a bias for MP7, and the current through MP5 in the saturation region is $I_{CM}$). MP6 is also a diode connected transistor (gate and source of MP6 are connected), and the drain of MP5 is connected to the source of MP6. The drain of MP6 is connected to current source $I_{CM}$.

Example Current Amplifiers in Low-Headroom, High-Frequency Configuration

Figure 10:
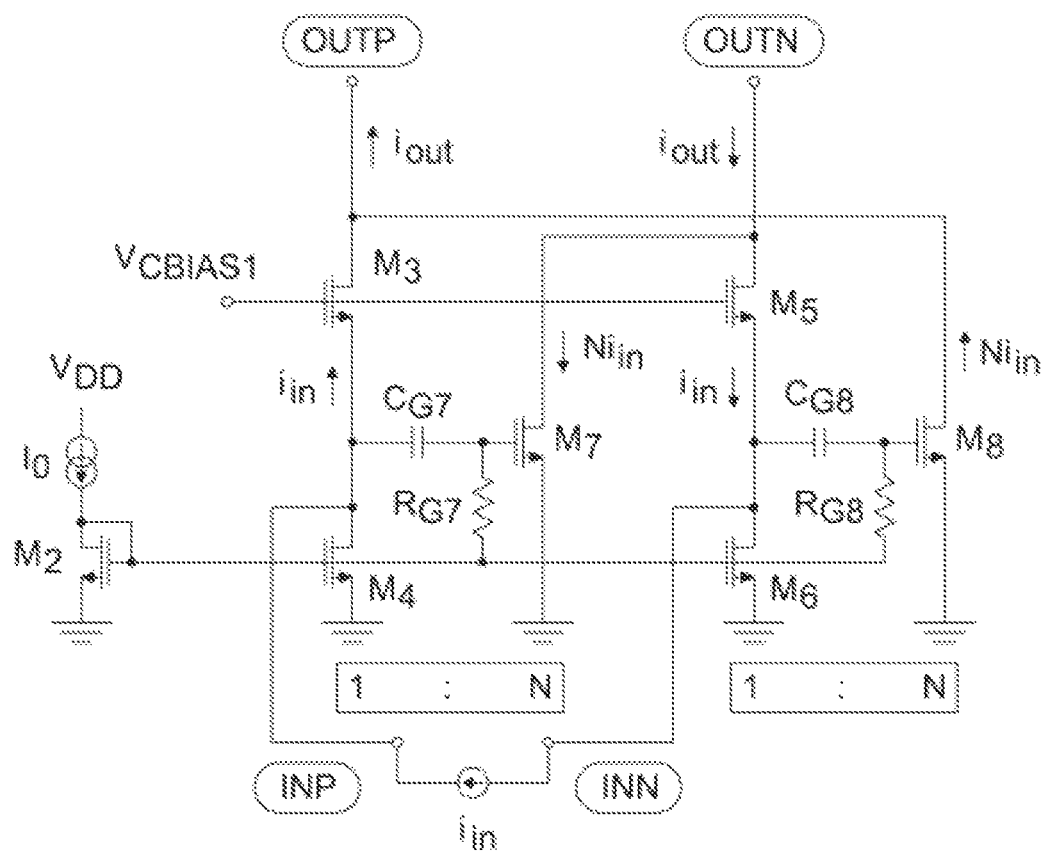
FIG. 10 is a diagram illustrating a low-headroom, high-frequency CMOS current amplifier with AC-coupling in the amplifier core, according to some embodiments of the disclosure.

FIG. 10 is a diagram illustrating a low-headroom, high-frequency CMOS current amplifier with AC-coupling in the amplifier core, according to some embodiments of the disclosure. One feature of this configuration is the simplified reference branch where the current source $I_0$ is accompanied by only one diode-connected transistor M2 (M1 is removed, thereby requiring less headroom). In this example, the first secondary branch is coupled to the first primary branch via alternating current (AC) coupling. The second secondary branch is coupled to the second secondary branch via alternating current (AC) coupling. In this example, the transistors M3, M4, M5, and M6 are identically scaled replicas of transistor M2. The gate widths W and lengths L of transistors M7 and M8 are such that $$\left(\frac{W}{L}\right)_{7,8} = N \cdot \left(\frac{W}{L}\right)_{3,5}.$$

The alternating current coupling comprises a capacitor in series with the respective differential input nodes acting as a short circuit at particular frequencies. In the example shown, the gate of M7 is connected at sufficiently high frequencies to the first primary branch (i.e., the source of M3) via capacitor $C_{G7}$, and the gate of M7 is connected at DC to the first primary branch (i.e., the gate of M4) via resistor $R_{G7}$. Similarly, the gate of M8 is connected at sufficiently high frequencies to the second primary branch (i.e., the source of M5) via capacitor $C_{G8}$, and the gate of M8 is connected at DC to the first primary branch (i.e., the gate of M6) via resistor $R_{G8}$. Resistors $R_{G7}$ and $R_{G8}$ are negligibly large, and $C_{G7}$ and $C_{G8}$ ($C_{G7}=C_{G8}$) are short circuits at frequencies of interest $$\left(\text{e.g., } \frac{1}{2\pi R_{G7,8} C_{G7,8}} \ll \text{input frequency}\right),$$

and the first bias voltage $V_{CBIAS1}$ can be chosen small enough such that M4, M6 operate in the saturation region and barely above the triode region. In this way, the output voltage of the amplifier (on the drains of transistors M3, M5, M7 or M8) can be as low as $2V_{DSsat3,5}$ (twice the saturation voltage of transistors M3 and M5), which depending on transistor size and prescribed drain current, can be as low as 100 mV or lower. The small-signal equivalent circuit of the current amplifier of FIG. 10 is equivalent to the small-signal equivalent circuit of FIG. 2. Furthermore, the small signal current gain of the current amplifier of FIG. 10 is (N+1), which is the same as the current gain of the current amplifier of FIG. 2.

Figure 11:
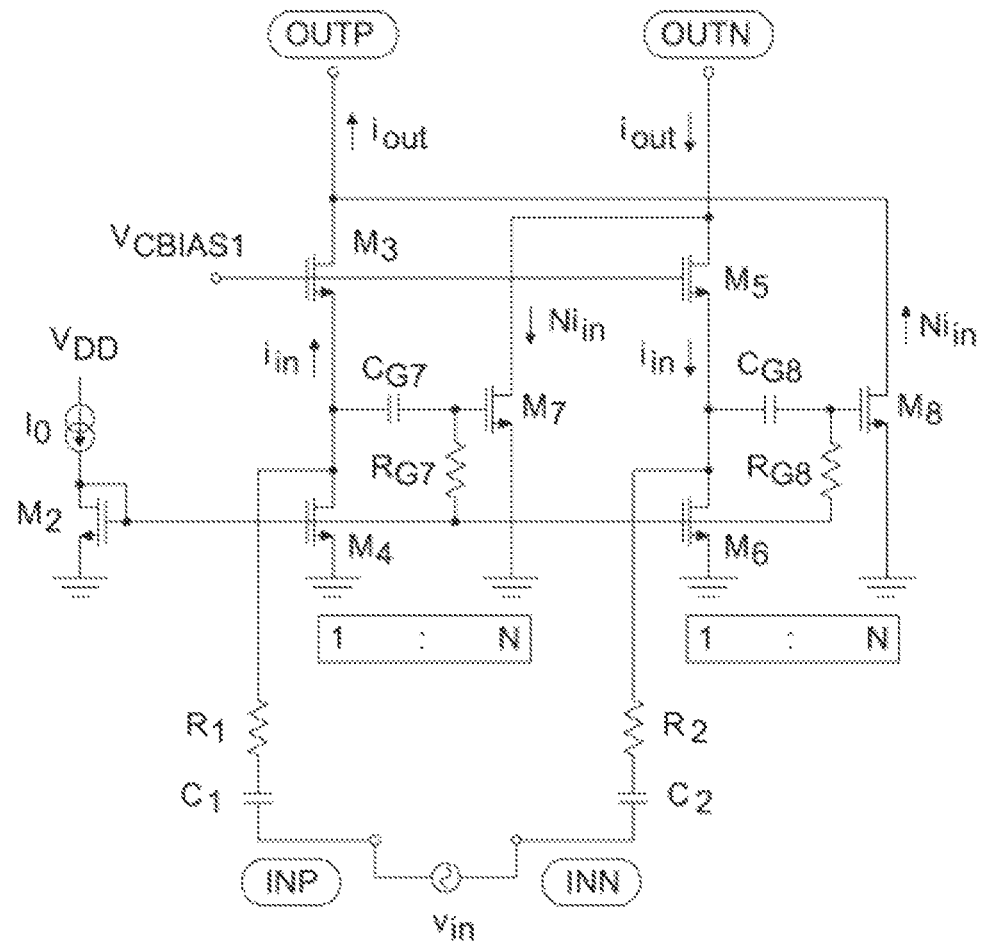
FIG. 11 is a diagram detailing a low-headroom, high-frequency CMOS transconductance amplifier with AC-coupling in the amplifier core, according to some embodiments of the disclosure.

FIG. 11 is a diagram detailing a low-headroom, high-frequency CMOS transconductance amplifier with AC-coupling in the amplifier core, according to some embodiments of the disclosure. This example adds the transconductance configuration shown in FIG. 6 to the circuit shown in FIG. 10. Specifically, the alternating current (AC) coupled resistors each comprising a capacitor and a resistor in series with the differential input nodes INP and INN can be provided. Specifically, C1 and R1 are connected in series with input node INP, and C2 and R2 are connected in series with input node INN. The AC coupled resistors can be provided for converting the input voltage signal $v_{in}$ into the input current signal $i_{in}$. Preferably, R1 and R2 are substantially identical with the same resistance (R1=R2). C1 and C2 are also preferably substantially identical with the same capacitance (C1=C2). The DC blocking capacitors C1 and C2 can serve as short-circuits at the frequencies of interest. The result shown in FIG. 11 is a low-headroom transconductance amplifier whose gain is the same as the transconductance amplifier shown in FIG. 6.

Figure 12:
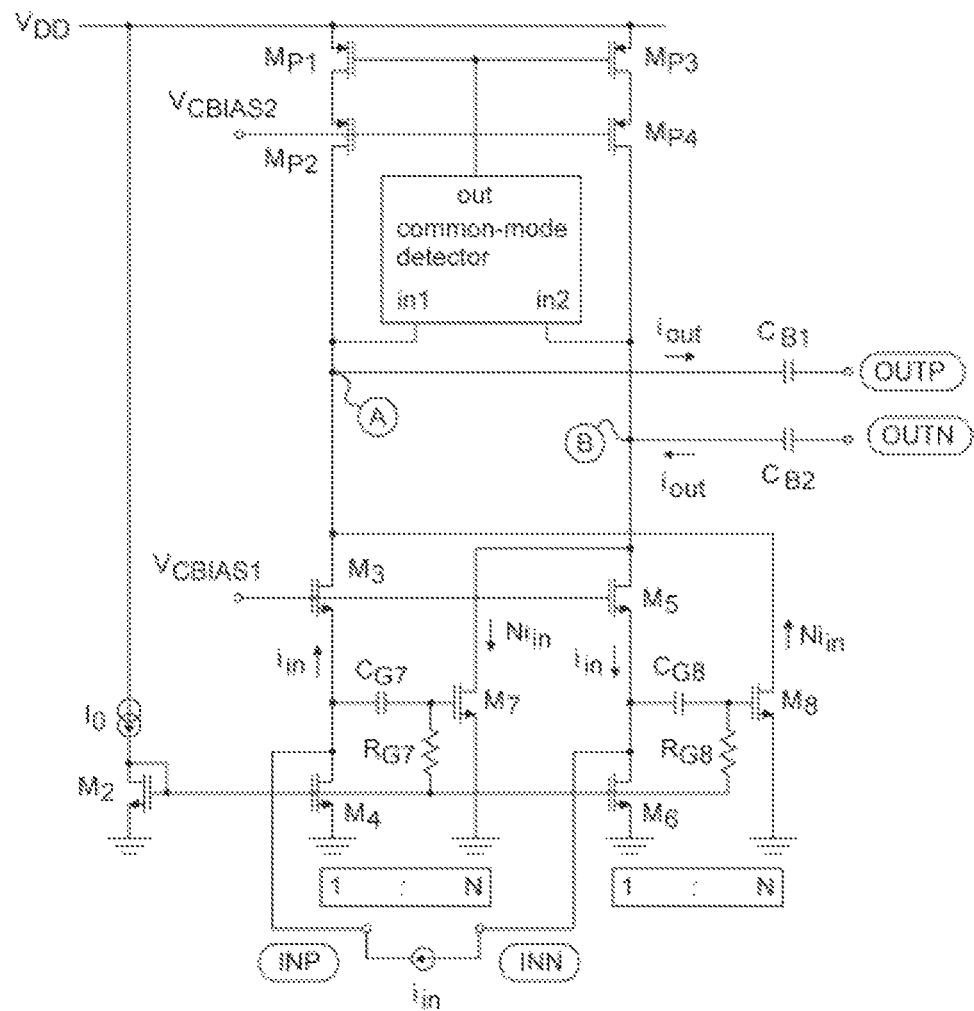
FIG. 12 is a diagram detailing a differential load with a common-mode detector for accommodating the DC currents of the current amplifier of FIG. 10, according to some embodiments of the disclosure.
Figure 13:
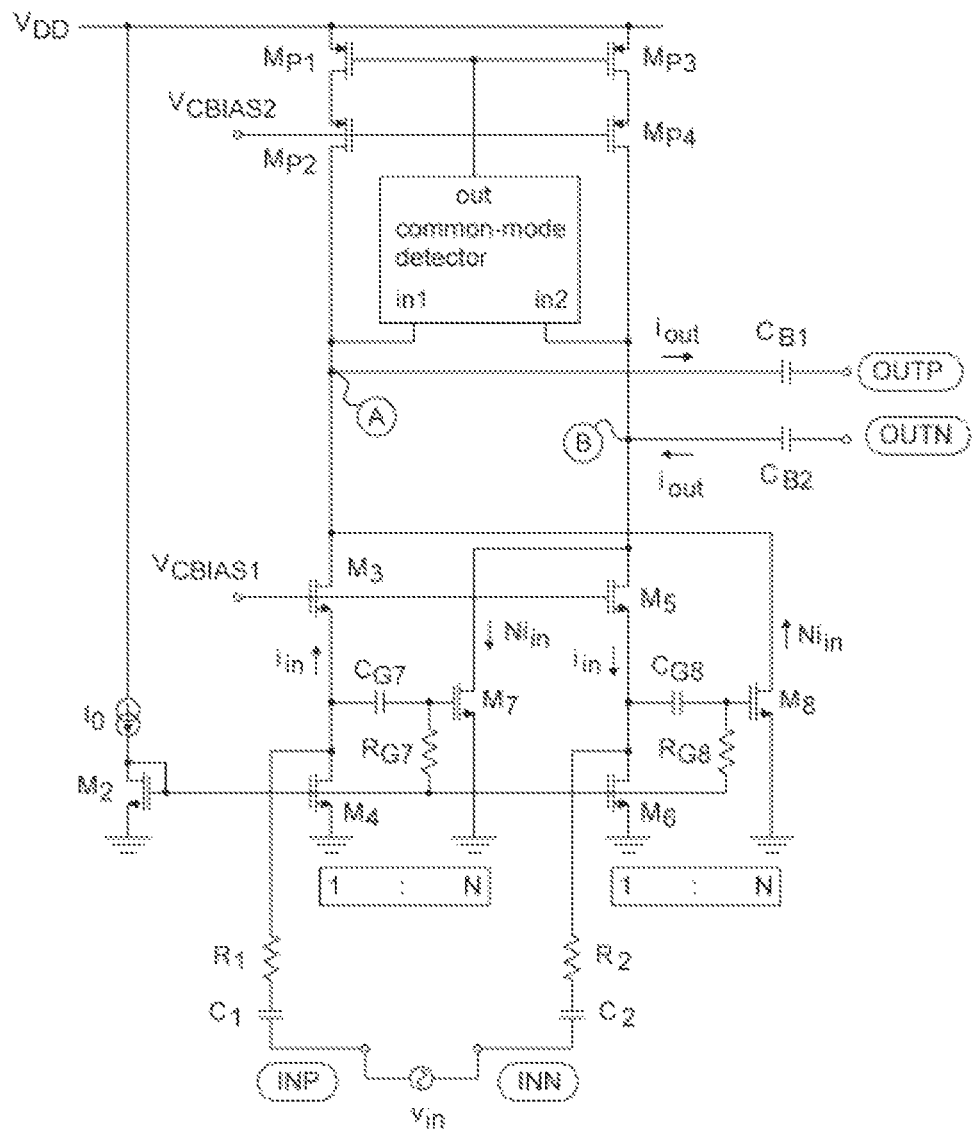
FIG. 13 is a diagram detailing a differential load with a common-mode detector for accommodating the DC currents of the transconductance amplifier of FIG. 11, according to some embodiments of the disclosure.

FIG. 12 is a diagram detailing a differential load with a common-mode detector for accommodating the DC currents of the current amplifier of FIG. 10, according to some embodiments of the disclosure. The embodiment shown in FIG. 12 combines the circuit shown in FIG. 10 with the current absorbing circuits and common mode detector shown in FIG. 7 (which could be implemented using configurations shown in FIGS. 8 and 9. FIG. 13 is a diagram detailing a differential load with a common-mode detector for accommodating the DC currents of the transconductance amplifier of FIG. 11, according to some embodiments of the disclosure. This embodiment combines the circuit shown in FIG. 11 with the current absorbing circuits and common mode detector shown in FIG. 7 (which could be implemented using configurations shown in FIGS. 8 and 9.

Bipolar-Junction Versions of the Improved Current Amplifier

Many of the embodiments shown in FIGS. 1-13 are shown with a CMOS implementation. It is noted, however, that the embodiments or variations thereof can be implemented using bipolar junction transistors (BJTs), where all the components of the BJT implementation have a direct correspondence to their CMOS counterparts. Rather than scaling the widths and lengths of transistors to achieve current gain, bipolar transistor scaling is achieved by emitter area scaling to increase the current going through the transistors.

Figure 14:
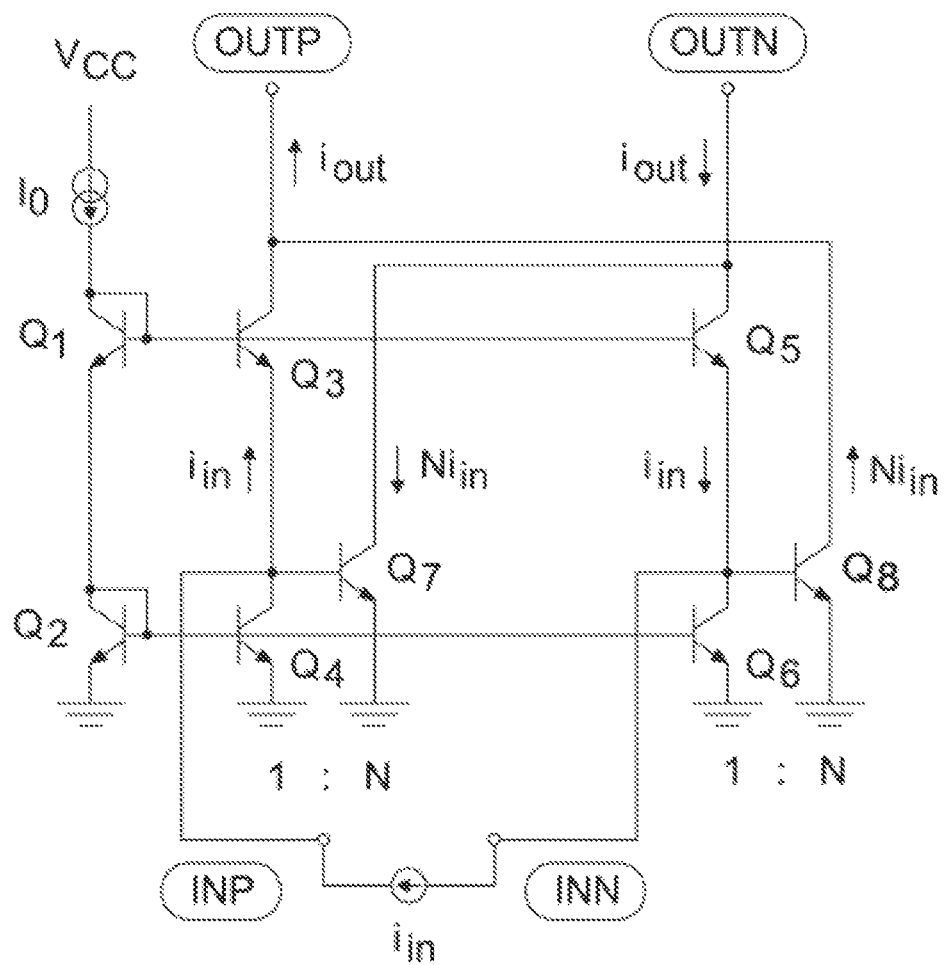
FIG. 14 is a diagram illustrating a bipolar differential current amplifier having a gain of (N+1), according to some embodiments of the disclosure.

FIG. 14 is a diagram illustrating a bipolar differential current amplifier having a gain of (N+1), according to some embodiments of the disclosure. This BJT configuration is equivalent to the CMOS version shown in FIG. 2. The example shown includes a first primary branch comprising two transistors Q3 and Q4. In this BJT implementation, the emitter of Q3 is connected to the collector of Q4, and the input current signal $i_{in}$ is injected between Q3 and Q4 (i.e., at the emitter of Q3 and at the collector of Q4). The collector of Q3 is connected to the output node OUTP, and the emitter of Q4 is connected to ground. The second primary branch comprises two transistors Q5 and Q6. Similar to the first primary branch, the emitter of Q5 is connected to the collector of Q6, and the complement of the input current signal $-i_{in}$ is injected between Q5 and Q6 (i.e., at the emitter of Q5 and at the collector of Q6). The collector of Q5 is connected to the output node OUTN, and the emitter of Q6 is connected to ground.

Further to primary branches, a reference branch is provided to operate the transistors of the primary branches (Q3, Q4, Q5, and Q6) in the active region. The reference branch comprises a current source $I_0$ and one or more diode-connected transistors, such as Q1 and Q2 (e.g., NPN BJTs where the collector of the transistor is connected to the base of the transistor). The diode-connected transistors Q1 and Q2 are substantially identical, and are provided to establish the DC operating points through branches formed by Q3, Q4, Q5, and Q6. The transistors Q3, Q4, Q5, and Q6 can be identical scaled versions of transistors Q1 or Q2.

The structure furthermore adds a first and second secondary branches scaled with respect to the first and second primary branches and cross-coupled relative to the outputs the first and second primary branches to provide current gain, wherein the current gain is based on a scaling factor between the primary branches and the secondary branches. The result is a differential current amplifier configured for providing an amplified current output signal $i_{out}=(N+1)i_{in}$ at a pair of differential output nodes (OUTP and OUTN) based on an input current signal $i_{in}$ provided at a pair of differential inputs nodes (INP and INN). Furthermore, the output currents of the first and second primary branches (equivalent to $i_{in}$ and $-i_{in}$ respectively) are constructively added to the output currents of the second and first secondary branches respectively (equivalent to $Ni_{in}$ for the second secondary branch and $-Ni_{in}$ for the first secondary branch) to provide the amplified current output signal $i_{out}=(N+1)i_{in}$ at the pair of differential output nodes OUTP and OUTN. The overall gain of the amplified current output signal relative to the input current signal is thus 1 plus the scaling factor N.

In this illustration, the first secondary branch includes NPN BJT Q7 and the second secondary branch includes NPN BJT Q8. Q7 and Q8 are substantially identical. The first secondary branch is cross coupled relative to the output of the second secondary branch by connecting the collector of Q7 to the output of the second primary branch. The collector of Q4 is connected to the base of Q7. The second secondary branch is cross coupled relative to the output of the first primary branch by connecting the collector of Q8 to the output of the first primary branch. The collector of Q6 is connected to the base of Q8.

During operation, the input current signal $i_{in}$ injected at the first primary branch provides a first voltage at the node connecting the collector of Q4, the emitter of Q3, and the base of Q7 for operating Q7 of the first secondary branch in the active region. Accordingly, Q7 draws a first scaled current $Ni_{in}$ at the output of the second primary branch ($Ni_{in}$ being constructively added to $i_{out}=i_{in}$ present the output terminal OUTN). Furthermore, the input current signal $-i_{in}$ injected at the second primary branch provides a second voltage at the node connecting the collector of Q6, the emitter of Q5, and the base of Q8 for operating Q8 of the second secondary branch in the active region. Accordingly Q8 draws a second scaled current $Ni_{in}$ at the output of the first primary branch ($Ni_{in}$ being constructively added to $i_{out}=i_{in}$ present the output terminal OUTP).

If the emitter areas of the Q7 and Q8 are selected according to a scaling factor N with respect to the transistors of the primary branches, then it can be shown that $i_{out}=(N+1)i_{in}$, which makes the circuit a differential current amplifier of gain (N+1).

Figure 15:
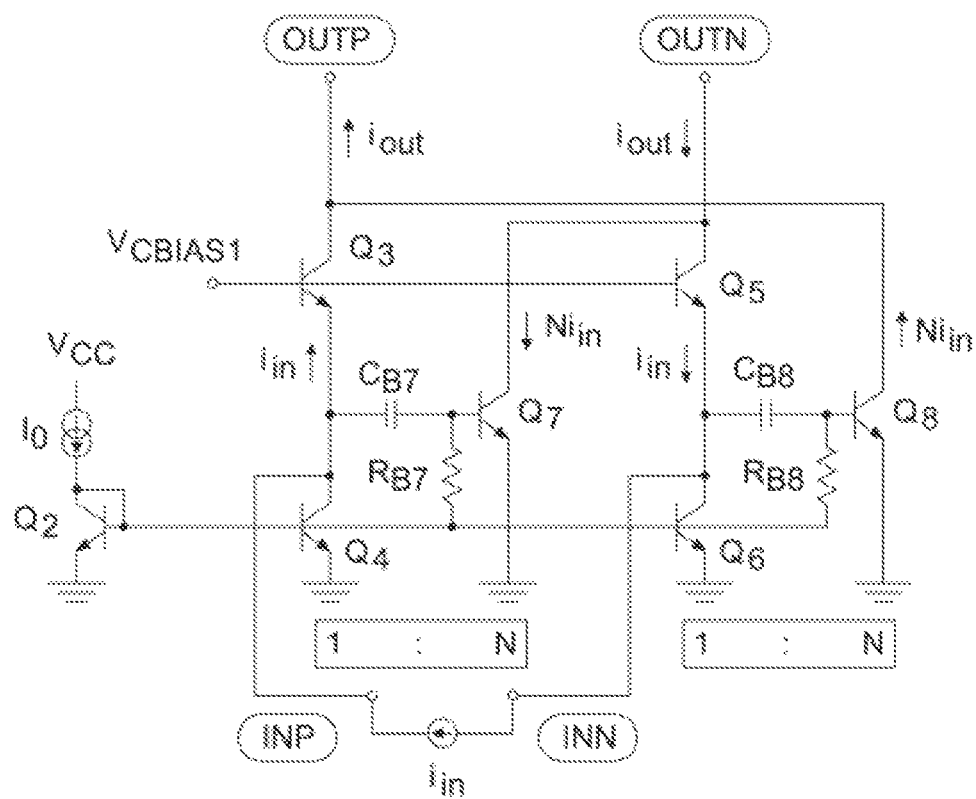
FIG. 15 is a diagram illustrating a low-headroom, high-frequency bipolar current amplifier with AC-coupling in the amplifier core, according to some embodiments of the disclosure.

FIG. 15 is a diagram illustrating a low-headroom, high-frequency bipolar current amplifier with AC-coupling in the amplifier core, according to some embodiments of the disclosure. This example illustrates that AC-coupling can also be applied to the BJT implementation to reduce the headroom needed for the current amplifier. One feature of this configuration is the simplified reference branch where the current source $I_0$ is accompanied by only one diode-connected transistor Q2 (Q1 is removed, thereby requiring less headroom). In this example, the first secondary branch is coupled to the first primary branch via alternating current (AC) coupling. The second secondary branch is coupled to the second secondary branch via alternating current (AC) coupling. In this example, the transistors Q3, Q4, Q5, and Q6 are identically scaled replicas of transistor Q2. The emitter area of Q7 and Q8 is designed to provide the scaling factor N with respect to transistor Q2 (or Q3, Q4, Q5, and Q6).

The alternating current coupling comprises a capacitor in series with the respective differential input nodes acting as a short circuit at particular frequencies. In the example shown, the base of Q7 is connected at sufficiently high frequencies to the first primary branch (i.e., the emitter of Q3) via capacitor $C_{B7}$, and the base of Q7 is connected at DC to the first primary branch (i.e., the base of Q4) via resistor $R_{B7}$. Similarly, the base of Q8 is connected at sufficiently high frequencies to the second primary branch (i.e., the emitter of Q5) via capacitor $C_{BB}$, and the base of Q8 is connected at DC to the first primary branch (i.e., the base of Q6) via resistor $R_{B8}$. Resistors $R_{B7}$ and $R_{B8}$ are sufficiently small for minimizing bias errors caused by the base currents of Q7 and Q8, and $C_{G7}$ and $C_{G8}$ ($C_{G7}=C_{G8}$) are short circuits at frequencies of interest $\left(\text{e.g., } \frac{1}{2\pi R_{B7,8} C_{B7,8}} \ll \text{input frequency}\right)$, and the first bias voltage $V_{CBIAS1}$ can be chosen small enough such that Q4, Q6 operate in the active region and barely above the saturation region. In this way, the output voltage of the amplifier (on the collectors of transistors Q3, Q5, Q7, or Q8) can be as low as $2V_{sat3,5}$ (twice the saturation voltage of transistors Q3 or Q5), which can be as low as several tens of mV or lower. The small-signal equivalent circuit of the current amplifier of FIG. 15 is equivalent as the small-signal equivalent circuit of FIG. 14. Furthermore, the small signal current gain of the current amplifier of FIG. 15 is (N+1), which is the same as the current gain of the current amplifier of FIG. 14.

Figure 16:
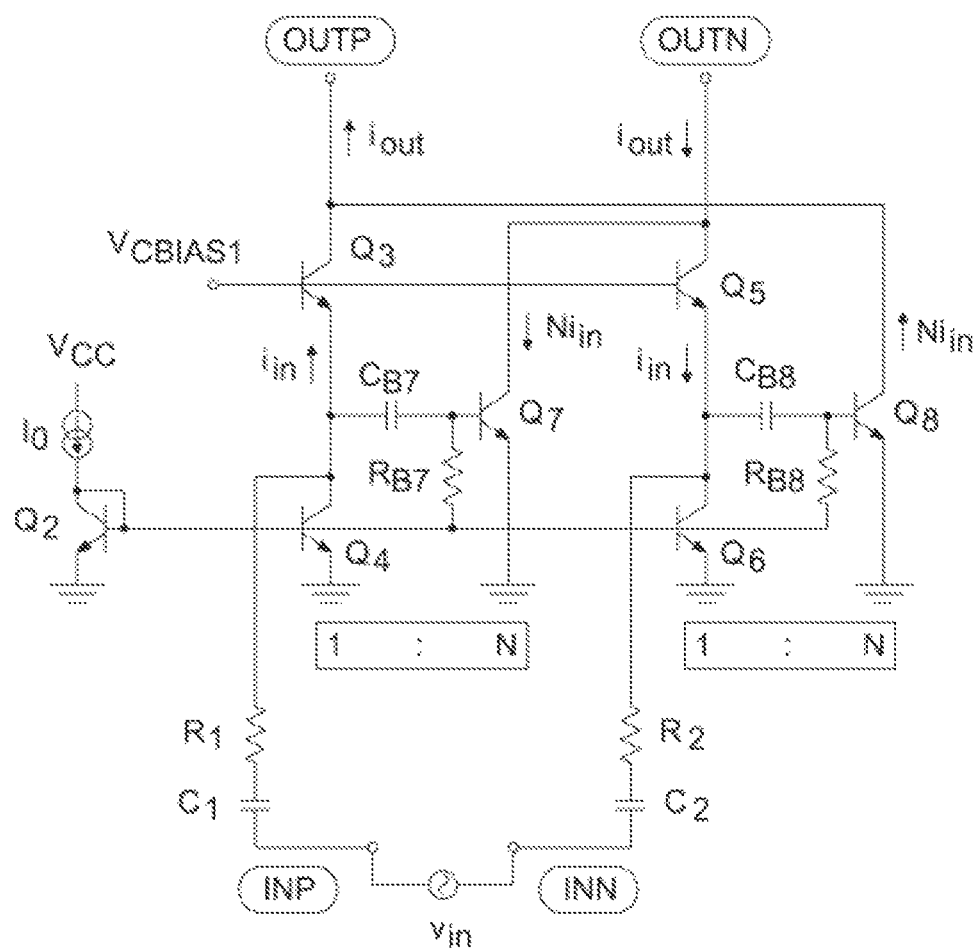
FIG. 16 is a diagram detailing a low-headroom, high-frequency bipolar transconductance amplifier with AC-coupling in the amplifier core, according to some embodiments of the disclosure.

FIG. 16 is a diagram detailing a low-headroom, high-frequency bipolar transconductance amplifier with AC-coupling in the amplifier core, according to some embodiments of the disclosure. This example adds the transconductance configuration shown in FIG. 6 to the circuit shown in FIG. 15. Specifically, the alternating current (AC) coupled resistors each comprising a capacitor and a resistor in series with the differential input nodes INP and INN can be provided. Specifically, C1 and R1 are connected in series with input node INP, and C2 and R2 are connected in series with input node INN. The AC coupled resistors can be provided for converting the input voltage signal $v_{in}$ into the input current signal $i_{in}$. Preferably, R1 and R2 are substantially identical with the same resistance (R1=R2). C1 and C2 are also preferably substantially identical with the same capacitance (C1=C2). The DC blocking capacitors C1 and C2 can serve as short-circuits at the frequencies of interest. The result shown in FIG. 16 is a low-headroom transconductance amplifier whose gain is $$A_y = \frac{i_{out}}{v_{in}} = \frac{N+1}{2\left(R_{1,2} + \frac{1}{g_{m3,5}}\right)},$$

where $g_{m3}=g_{m5}$ is the small-signal transconductance of transistor Q3 or Q5.

It is noted that these BJT implementations shown in FIGS. 14-16 can be provided with additional circuitry for absorbing common mode currents as well. For instance, BJT versions of the common mode detector and DC blocking capacitors (where CMOS transistors are replaced with equivalent BJT counterparts) shown in FIGS. 7-9 can be combined with the BJT implementations in FIGS. 14-16.

Exemplary Method for Providing an Amplified Current Output Signal

Figure 17:
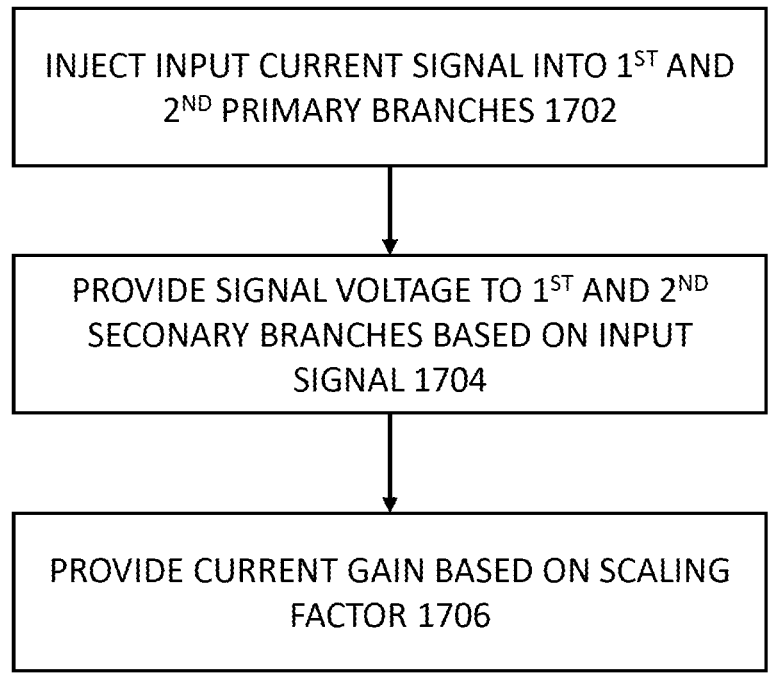
FIG. 17 shows a flow diagram illustrating a method for providing an amplified current output signal, according to some embodiments of the disclosure.

FIG. 17 shows a flow diagram illustrating a method for providing an amplified current output signal, according to some embodiments of the disclosure. Specifically, the method provides the amplified current output signal at a pair of differential output nodes based on an input current signal provided at a pair of differential inputs nodes. At box 1702, the input current signal ($i_{in}$) is injected into a first and second primary non-inverting unity-gain branches, wherein the input current signal is re-used at the differential output nodes. In this method, the flow of the input current signal is not diverted away from the output. Rather, the input current signal is used at the differential output nodes. At box 1704, a signal voltage is provided to a first and second secondary branches based on the input current signal. Specifically, the first and second secondary branches are scaled with respect to the first and second primary branches and cross-coupled relative to the outputs the first and second primary branches. The signal voltage helps to bias the secondary branches to provide current gain for the circuit. At box 1706, current gain is provided using the current generated by first and second secondary branches. Due to the scaling relationship between the primary and secondary branches, the current gain is based on a scaling factor between the primary branches and the secondary branches. Moreover, in contrast from a current mirror, the method provides the amplified current output signal at the pair of differential output nodes by constructively adding the output currents of the first and second primary branches are to the output currents of the second and first secondary branches respectively. An overall gain of the amplified current output signal relative to the input current signal is thus 1 plus the scaling factor.

Variations and Implementations

In the discussions of the embodiments above, the capacitors, resistors, amplifiers, transistors, and/or other components can readily be replaced, substituted, or otherwise modified in order to accommodate particular circuitry needs. Moreover, it should be noted that the use of complementary electronic devices, hardware, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the amplification functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of transistors, polarity of input or output signals, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular transistor and/or component arrangements. Various modifications and changes may be made to such embodiments without departing from the scope of the appended claims. The description and drawings are, accordingly, to be regarded in an illustrative rather than in a restrictive sense.

Note that the activities discussed above with reference to the FIGURES are applicable to any integrated circuits that involve analog signal processing, particularly those that can execute amplification, modulation, demodulation, mixing, multiplication, rectification, filtering, some of which may be associated with processing real-time data. Certain embodiments can additionally relate to multi-DSP signal processing, floating point processing, signal/control processing, fixed-function processing, microcontroller applications, etc.

In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc.

In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily be part of smartphones, tablets, security systems, PCs, gaming technologies, virtual reality, simulation training, etc.

Note that with the numerous examples provided herein, interaction may be described in terms of two, three, four, or more electrical components. However, this has been done for purposes of clarity and example only. It should be appreciated that the system can be consolidated in any suitable manner.

Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to differential current amplifiers, illustrate only some of the possible current amplifier functions that may be executed by, or within, systems illustrated in the FIGURES. Some of these operations may be deleted or removed where appropriate, or these operations may be modified or changed considerably without departing from the scope of the present disclosure. The preceding operational flows have been offered for purposes of example and discussion. Substantial flexibility is provided by embodiments described herein in that any suitable arrangements, chronologies, and configurations may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

Note that all optional features of the apparatus described above may also be implemented with respect to the method or process described herein and specifics in the examples may be used anywhere in one or more embodiments.

What is claimed is:

1. A differential current amplifier for providing an amplified current output signal at a pair of differential output nodes based on an input current signal provided at a pair of differential inputs nodes, the differential current amplifier comprising:
    a first and second primary non-inverting unity-gain branches having the input current signal injected into the respective first and second primary branches and providing output currents at the differential output nodes, wherein the output currents substantially reuses all of the input current signal at the differential output nodes; and
    a first and second secondary branches scaled with respect to the first and second primary branches and cross-coupled relative to outputs the first and second primary branches to provide scaled output currents at the differential output nodes based on a scaling factor N between the primary branches and the secondary branches, wherein N is greater than zero;
    wherein an overall gain of the amplified current output signal relative to the input current signal is 1 plus N.

2. The differential current amplifier of claim 1, wherein the output currents of the first and second primary branches are constructively added to the scaled output currents of the second and first secondary branches respectively to provide the amplified current output signal at the pair of differential output nodes.

3. The differential current amplifier of claim 1, wherein the gate widths and lengths of transistors in the first and secondary branches are selected according to the scaling factor N with respect to the transistors of the first and second primary branches.

4. The differential current amplifier of claim 1, wherein:
    the first primary branch comprises a first transistor and a second transistor; and
    the second primary branch comprises a third transistor and a fourth transistor, wherein the first, second, third, and fourth transistors are substantially identical in size.

5. The differential current amplifier of claim 4, further comprising:
    a reference branch for operating the first transistor, the second transistor, the third transistor, and the fourth transistor in a saturation or an active region.

6. The differential current amplifier of claim 5, wherein the reference branch comprises:
    a current source and one or more diode-connected transistors.

7. The differential current amplifier of claim 1, wherein:
    the first secondary branch comprises a fifth transistor scaled with respect to the first and second primary branches according to the scaling factor N and cross-coupled relative to the output of the second primary branch; and
    the second secondary branch comprises a sixth transistor, wherein the sixth transistor is scaled with respect to the first and second primary branch according to the scaling factor N, and is cross-coupled relative to the output of the first primary branch.

8. The differential current amplifier of claim 7, wherein:
    the input current signal injected at the first primary branch provides a first voltage at a first node coupling the first primary branch and the first secondary branch for operating the fifth transistor of the first secondary branch in a saturation or an active region to provide a first scaled current at the output of the second primary branch according to the scaling factor N; and
    the input current signal injected at the second primary branch provides a second voltage at a second node coupling the second primary branch and the second secondary branch for operating the sixth transistor of the second secondary branch in a saturation or an active region to provide a second scaled current at the output of the first primary branch according to the scaling factor N.

9. The differential current amplifier of claim 1, further comprising:
cascode transistors at the outputs of the first primary branch and the second primary branch for providing output impedance, wherein a first bias voltage is provided to the cascode transistors to operate transistors in the first and second primary branches and transistors of the first and second secondary branches in a saturation or an active region.

10. The differential current amplifier of claim 9, further comprising:
a reference branch having a diode connected transistor or having a self-biased cascode configured to provide the first bias voltage for the cascode transistors.

11. The differential current amplifier of claim 1, further comprising:
two alternating current coupled resistors each comprising a capacitor and a resistor in series with the differential input nodes for converting an input voltage signal into the input current signal.

12. The differential current amplifier of claim 1, further comprising:
direct current blocking capacitors in series with the differential output nodes for providing bidirectional currents at the differential output nodes.

13. The differential current amplifier of claim 1, further comprising:
a common mode detector circuit connected to the outputs of the first and second primary branches for providing, as output, common mode voltage present at the outputs of the first and second primary branches; and
current absorbing circuits connected to respective outputs of the first and second primary branches, wherein the transistors of the current absorbing circuits are biased by a second bias voltage and the output of the common mode detector.

14. The differential current amplifier of claim 13, wherein:
the common mode detector circuit provides negative feedback to the current absorbing circuits to absorb common mode currents present at the outputs of the first and second primary branches.

15. The differential current amplifier of claim 13, wherein:
the common mode detector circuit comprises two equally sized resistors connected across outputs of the first and second primary branches; and
the output of the common mode detector is taken at a node between the two equally sized resistors having a voltage proportional to common mode voltage present at the outputs of the first and second primary branches.

16. The differential current amplifier of claim 13, further comprising a current source for operating the current absorbing circuits in a saturation or an active region.

17. The differential current amplifier of claim 1, wherein:
the first secondary branch is coupled to the first primary branch via alternating current coupling; and
the second secondary branch is coupled to the second secondary branch via alternating current coupling;
wherein the alternating current coupling comprises a capacitor in series with the respective differential input nodes acting as a short circuit at particular frequencies.

18. A method for providing an amplified current output signal at a pair of differential output nodes based on an input current signal provided at a pair of differential inputs nodes, the method comprising:
outputting output currents to the differential output nodes by a first and second primary non-inverting unity-gain branches, wherein the input current signal is injected into the first and second primary non-inverting unity-gain branches, and substantially all of the input current signal is reused at the differential output nodes;
providing, by the first and second primary branches, a signal voltage to a first and second secondary branches based on the input current signal, wherein the first and second secondary branches are scaled with respect to the first and second primary branches according to a scaling factor N and cross-coupled relative to outputs the first and second primary branches, and N is greater than zero;
generating, by the first and second secondary branches, scaled output currents based on the signal voltage, wherein the scaled output currents have a current gain of N;
wherein an overall gain of the amplified current output signal relative to the input current signal is 1 plus N.

19. The method of claim 18, further comprising:
providing the amplified current output signal at the pair of differential output nodes by constructively adding the output currents of the first and second primary branches to the scaled output currents of the second and first secondary branches respectively.

20. An apparatus for providing an amplified current output signal at a pair of differential output nodes based on an input current signal provided at a pair of differential inputs nodes, the apparatus comprising:
a first and second primary non-inverting unity-gain circuit means for receiving the input current signal and generating output currents that reuses substantially all of the input current signal at the differential output nodes; and
a first and second secondary circuit means coupled to the first and second primary non-inverting unity gain circuit means respectively, scaled with respect to the first and second primary branches according to a scaling factor N, and cross-coupled relative to outputs the first and second primary branches, for generating scaled output currents according to N, wherein N is greater than zero;
wherein the output currents and the scaled output currents are constructively added at the differential output nodes, providing an overall gain of the amplified current output signal of 1 plus N relative to the input current signal.

* * * * *